United States Patent [19]
Kang

[11] Patent Number: 5,999,024
[45] Date of Patent: Dec. 7, 1999

[54] WIDE BAND PHASE LOCKED LOOP CIRCUIT USING NARROW BAND VOLTAGE CONTROLLED OSCILLATOR

[75] Inventor: Seok-Gyu Kang, Seoul, Rep. of Korea

[73] Assignee: Samsung Electronics Co., Ltd., Kyungki-do, Rep. of Korea

[21] Appl. No.: 08/996,880

[22] Filed: Dec. 23, 1997

[30] Foreign Application Priority Data

Dec. 23, 1996 [KR] Rep. of Korea ............... 96-70544

[51] Int. Cl.⁶ .................................................. H03L 7/06
[52] U.S. Cl. ..................... 327/156; 327/159; 331/DIG. 2
[58] Field of Search .................................. 327/156, 159; 331/16–18, 25, DIG. 2

[56] References Cited

U.S. PATENT DOCUMENTS

| 4,516,083 | 5/1985 | Turney | 331/16 |
| 5,325,075 | 6/1994 | Rapeli | 331/16 |
| 5,334,952 | 8/1994 | Maddy et al. | 331/16 |
| 5,371,480 | 12/1994 | Hedberg et al. | 331/16 |

*Primary Examiner*—Kenneth B. Wells
*Attorney, Agent, or Firm*—Sughrue, Mion, Zinn, Macpeak & Seas, PLLC

[57] ABSTRACT

A wide band phase locked loop using a narrow band voltage controlled oscillator is provided. The wide band phase locked loop circuit includes a frequency and phase detector for generating a signal corresponding to a difference in a frequency and a phase between an input signal and a reference signal and a loop filter for filtering the signal generated by the frequency and phase detector to a predetermined frequency band. The filtered signal from the loop filter is provided to a narrow band voltage controlled oscillator which generates a signal having a frequency varying according to a voltage of the filtered signal, and a level detector which generates dividing ratio control information by detecting a voltage level of the filtered signal. A variable frequency divider generates the reference signal by dividing the signal generated from the voltage controlled oscillator by a dividing ratio determined according to the dividing ratio control information.

7 Claims, 2 Drawing Sheets

WIDE BAND PHASE LOCKED LOOP CIRCUIT USING NARROW BAND VOLTAGE CONTROLLED OSCILLATOR

FIELD OF THE INVENTION

The present invention relates to a wide band phase locked loop and, more particularly, to a wide band phase locked loop using a narrow band voltage controlled oscillator.

DESCRIPTION OF THE RELATED ART

A typical phase locked loop (PLL) is widely employed in communication equipment, control equipment, etc., and used for stabilizing a circuit by locking a phase to an input signal. Recently, a wide band PLL having a wider operating range of the input signal than the typical PLL has been used. For the wide band PLL, a wide band voltage controlled oscillator (VCO) is used.

FIG. 1 shows a conventional wide band PLL using a wide band VCO. A frequency and phase detector 10 generates a voltage Vd(t) corresponding to a difference in a frequency and a phase between two input signals Vs(t) and Vref(t). A loop filter 20, which is a low pass filter, eliminates a high frequency component of the voltage Vd(t) generated by the frequency and phase detector 10 to generate a voltage Ve(t) suitable for the characteristic of a system. A wide band VCO 30 generates the signal Vref(t) whose oscillating frequency is variable according to the voltage Ve(t) generated by the loop filter 20.

In operation, the input signal Vs(t) and the reference signal Vref(t) are applied to the frequency and phase detector 10. The frequency and phase detector 10 compares the frequency and phase of the input Vs(t) with the frequency and phase of the reference signal Vref(t) and generates the voltage Vd(t). The voltage Vd(t) is supplied to the loop filter 20 which generates the voltage Ve(t) filtered to a signal suitable for the system. The voltage Ve(t) generated by the loop filter 20 is applied to the wide band VCO 30 which generates the reference signal Vref(t) having the oscillating frequency corresponding to the control voltage Ve(t). The reference signal Vref(t) is fed back to the frequency and phase detector 10. By repeatedly performing such a control loop, a signal locked with the frequency and phase of the input signal Vs(t) having a wide range is generated.

As described above, the wide band VCO 30 is used in the conventional wide band PLL. However, it is difficult to manufacture the wide band VCO and the cost of manufacturing the wide band VCO is high.

SUMMARY OF THE INVENTION

The present invention provides an apparatus for processing a wide frequency band of an input signal by a wide band PLL using a narrow band voltage controlled oscillator.

A wide band phase locked loop circuit embodying the present invention includes a frequency and phase detector for generating a signal corresponding to a difference in a frequency and a phase between an input signal and a reference signal, a loop filter for filtering the signal generated from the frequency and phase detector to a predetermined frequency band, a voltage controlled oscillator for generating a signal having a frequency varying according to a voltage of a signal generated from the loop filter, a level detector for generating dividing ratio control information by detecting a voltage level of the signal generated from the loop filter, and a variable frequency divider for generating the reference signal by dividing the signal generated from the voltage controlled oscillator by a dividing ratio determined according to the dividing ratio control information.

BRIEF DESCRIPTION OF THE DRAWINGS

The features and advantages of the invention will become apparent from the following detailed description in conjunction with the accompanying drawings in which.

DETAILED DESCRIPTION OF THE PREFERRED EMBODIMENT

Figure 1:
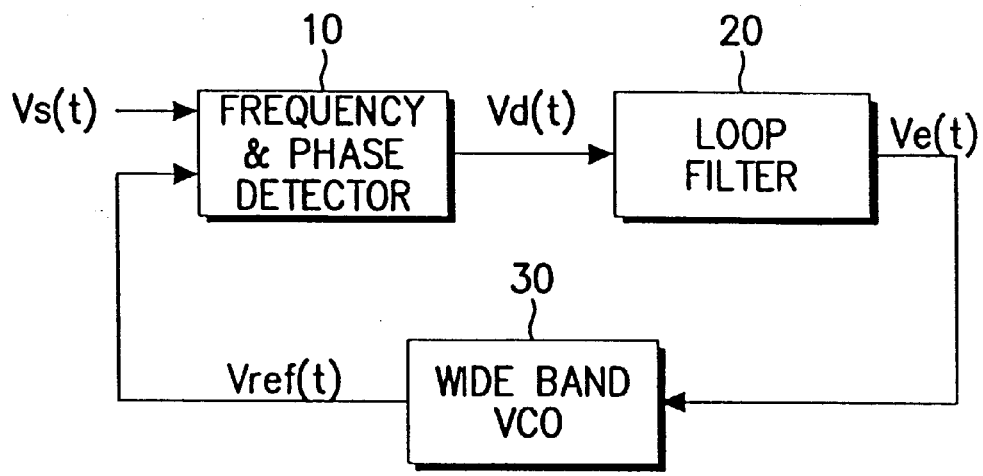
FIG. 1 is a block diagram of a conventional wide band phase locked loop using a wide band voltage controlled oscillator.
Figure 2:
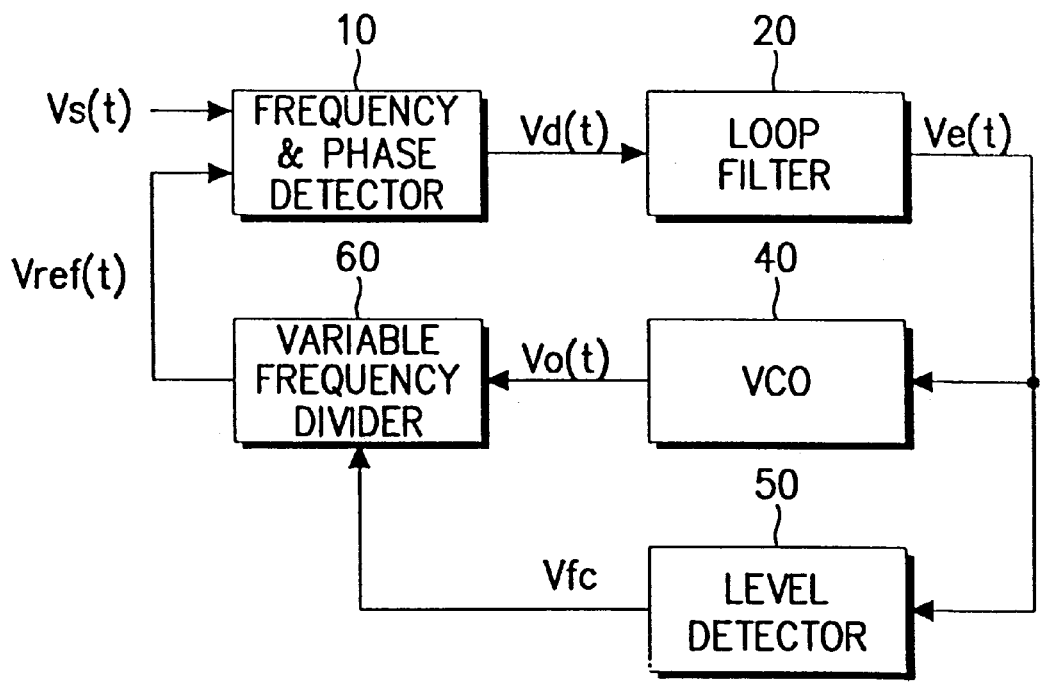
FIG. 2 is a block diagram of a wide band phase locked loop using a narrow band voltage controlled oscillator according to a preferred embodiment of the present invention.

FIG. 2 illustrates a wide band PLL using a narrow band VCO according to a preferred embodiment of the present invention. A frequency and phase detector 10 generates a voltage Vd(t) corresponding to a difference in a frequency and a phase between two input signals Vs(t) and Vref(t). A loop filter 20, which is a low pass filter, eliminates a high frequency component of the voltage Vd(t) generated from the frequency and phase detector 10 to produce a voltage Ve(t) suitable for the characteristic of a system. A VCO 40 has a narrow band characteristic and generates a signal Vo(t) having an oscillating frequency varying according to the voltage Ve(t) generated from the loop filter 20. Although the VCO 40 has the narrow band characteristic, the VCO 40 together with a level detector 50 and a variable frequency divider 60, exhibit a characteristic such as that of a wide band VCO. The level detector 50 detects a level value of the voltage Ve(t) generated from the loop filter 20 and generates control information Vfc corresponding to the detected level value. The level detector 50 uses an analog-to-digital converter for converting analog data into digital data having a predetermined number of bits. The variable frequency divider 60 adjusts a dividing ratio according to the control information Vfc generated from the level detector 50 and divides the signal Vo(t) generated from the VCO 40 by the dividing ratio to generate the reference signal Vref(t).

Figure 3:
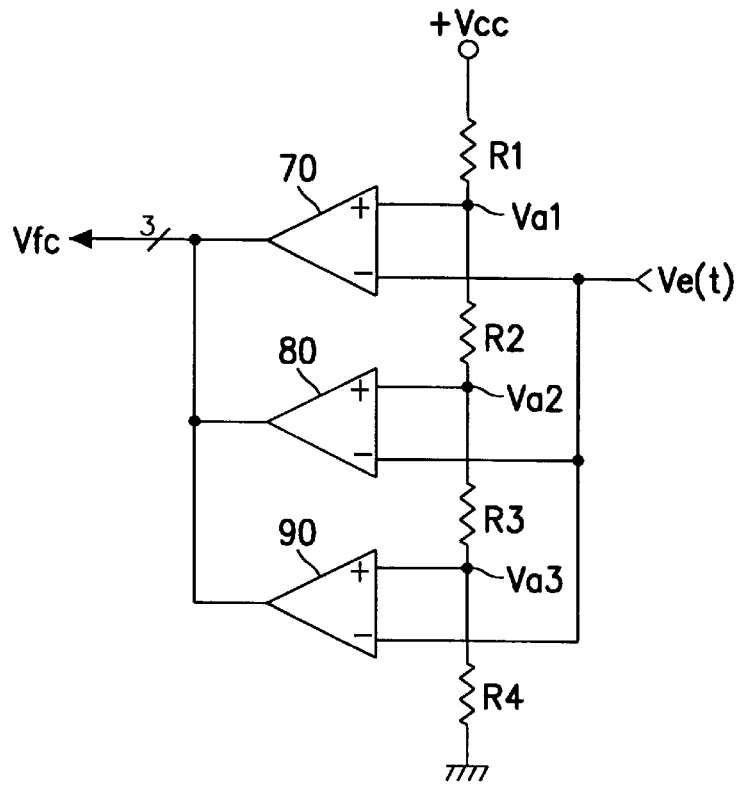
FIG. 3 is a detailed circuit diagram of a level detector shown in FIG. 2.

The detailed construction of the level detector 50 is shown in FIG. 3. Resistors R1, R2, R3 and R4 are serially connected between a supply voltage Vcc and a ground terminal. A noninverting terminal (+) of a first comparator 70 is connected between the resistors R1 and R2. The resistors R1, R2, R3 and R4 have the same resistance values and are used as a dividing circuit for dividing the supplying voltage Vcc into a predetermined ratio. A noninverting terminal (+) of a second comparator 80 is connected between the resistors R2 and R3. A noninverting terminal (+) of a third comparator 90 is connected between the resistors R3 and R4. Inverting terminals (−) of the comparators 70, 80 and 90 are connected to an output terminal of the loop filter 20 shown in FIG. 2. The comparators 70, 80 and 90 are used as a comparing circuit for generating dividing ratio control information Vfc comprising three bits by comparing voltages Va1, Va2 and Va3 divided by the resistors R1, R2, R3 and R4 with the voltage Ve(t) generated by the loop filter 20. The control information Vfc of three bits generated by the comparators 70, 80 and 90 is supplied to the variable frequency divider 60 shown in FIG. 2. The number of the comparators 70, 80 and 90 determines the number of dividing ratios divided through the variable frequency divider 60 shown in FIG. 2.

Figure 4:
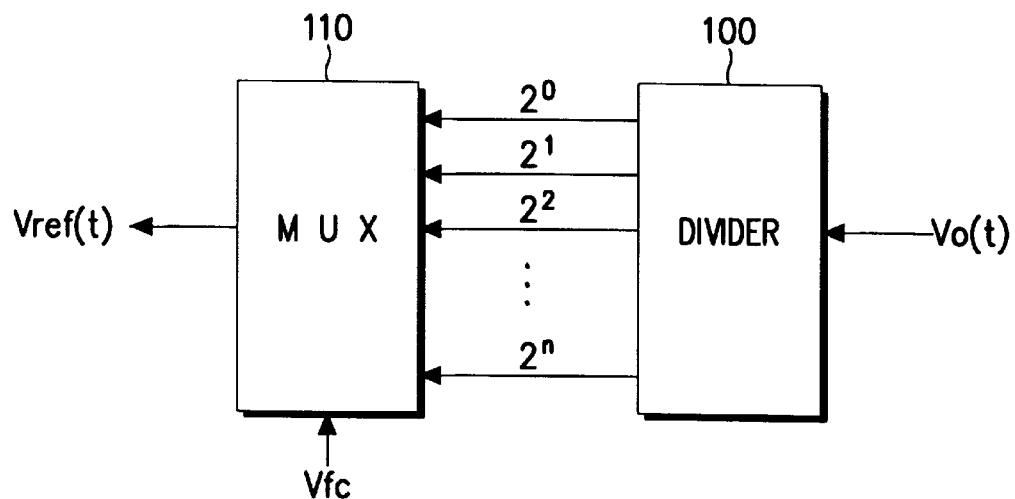
FIG. 4 is a detailed block diagram of a variable frequency divider shown in FIG. 2.

A detailed construction of the variable frequency divider 60 is illustrated in FIG. 4. A divider 100 divides the frequency of the voltage Vo(t) generated from the VCO 40 shown in FIG. 2 by a predetermined dividing ratio. A multiplexer (MUX) 110 selects one of signals generated by the divider 100 according to the control information Vfc generated by the level detector 50 and generates the selected signal as the reference signal Vref(t).

The operation of the wide band PLL according to the present invention will now be described in detail with reference to FIGS. 2, 3 and 4. The input signal Vs(t) and the reference signal Vref(t) are supplied to the frequency and phase detector 10 which compares the frequency and phase of the input Vs(t) with the frequency and phase of the reference signal Vref(t) and generates a comparison result Vd(t). The voltage Vd(t) is provided to the loop filter 20 which generates the voltage Ve(t) having a frequency band suitable for the characteristic of the system. The voltage Ve(t) generated from the loop filter 20 is supplied to the VCO 40 and the level detector 50. The level detector 50 detects the level of the voltage Ve(t) and generates the control information Vfc for determining the dividing ratio of the variable frequency divider 60. If the resistors R1, R2, R3 and R4 constituting the level detector 50 are equal to one another, the reference voltages Va1, Va2 and Va3 supplied to the comparators 70, 80 and 90 can be expressed by the following equations:

$$Va1 = \frac{3}{4} \times Vcc$$

$$Va2 = \frac{2}{4} \times Vcc$$

$$Va3 = \frac{1}{4} \times Vcc$$

where Va1, Va2 and Va3 are the reference voltages of the first, second and third comparators 70, 80 and 90, respectively. If the voltage Ve(t) generated by the loop filter 20 is greater than or equal to the reference voltages Va1, Va2 and Va3, the comparators 70, 80 and 90 respectively generate the dividing ratio control information of logic "LOW", otherwise they respectively generate the dividing ratio control information of logic "HIGH". If the voltage Ve(t) is greater than or equal to the reference voltage Va3 and less than the reference voltage Va2 (that is, Va3≦Ve(t)<Va2), the first and second comparators 70 and 80 generate the dividing ratio control information of logic "HIGH" and the third comparator 90 generates the dividing ratio control information of logic "LOW". Therefore, the dividing ratio control information of 3 bits generated from the level detector 50 is "110".

The VCO 40 generates the voltage Vo(t) having the frequency varying according to the level of the voltage Ve(t) generated by the loop filter 20. The VCO 40 for varying the frequency according to the level of the input voltage is well known in the art and therefore will not be described in detail herein.

The dividing ratio control information Vfc generated by the level detector 50 and the voltage Vo(t) generated from the VCO 40 are supplied to the variable frequency divider 60. The variable frequency divider 60 divides the voltage Vo(t) by a dividing ratio selected by the control information Vfc to generate the reference signal Vref(t).

An example of the detailed operation of the variable frequency divider 60 will now be described with reference to FIG. 4. The voltage Vo(t) generated from the VCO 40 is $2^0, 2^1, 2^2, 2^3, \ldots, 2^n$-divided through the divider 100 and the divided signals are supplied to the multiplexer 110. The multiplexer 110 receives the dividing ratio control information Vfc from the level detector 50 and selects one of the divided signals. For example, if the control information of "110" is received, the multiplexer 110 selects a $2^2$-divided signal produced from the divider 100 as the reference signal Vref(t). The reference signal Vref(t) returns back to the frequency and phase detector 10.

When the control information Vfc generated from the level detector 50 is 3 bits, the dividing ratio is listed below in Table 1.

TABLE 1

| Control information (Vfc) | Dividing ratio |
|---|---|
| 111 | $2^3$ |
| 110 | $2^2$ |
| 100 | $2^1$ |
| 000 | $2^0$ |

As shown in Table 1, since the control information Vfc is 3 bits, the signals selected from the multiplexer 110 have the dividing ratios within the range of $2^0$ to $2^3$.

Through a repeated implementation of the above control loop, if the input voltage Vs(t) has a low frequency, the voltage Ve(t) generated from the loop filter 20 becomes low. If the voltage Ve(t) becomes low, the level detector 50 generates the dividing ratio control information Vfc for selectively generating a signal having a high dividing ratio, that is, a signal having a low frequency from the variable frequency divider 60. If the input voltage Vs(t) has a high frequency, the voltage Ve(t) generated from the loop filter 20 becomes high. Then the level detector 50 generates the dividing ratio control information Vfc for selectively generating a signal which is not divided or has a low dividing ratio, that is, a signal having a high frequency. The VCO 40 has the same oscillating frequency and variable oscillating range as a typical VC0. However, the VC0 40 performs the same operation as a wide band PLL which is applicable to a low or high frequency of the input signal according to the dividing ratio.

As another embodiment of the present invention, the level detector 50 may determine the dividing ratio by using the input signal Vs(t) instead of the voltage Ve(t). That is, the dividing ratio may be determined by positioning the level detector 50 for determining the dividing ratio in front of the frequency and phase detector 10 and detecting the frequency of the input signal Vs(t).

In the wide band PLL of the present invention, the function of the wide band VCO is achieved by using a conventional (narrow band) VCO. Therefore, the manufacturing cost of the VCO can be reduced and it is easy to manufacture the VCO. Such a wide band PLL can be applied to circuits for locking the frequency.

While the invention has been shown and described with reference to a certain preferred embodiment thereof, it will be understood by those skilled in the art that various changes in form and details may be made therein without departing from the spirit and scope of the invention as defined by appended claims.

What is claimed is:

1. A wide band phase locked loop circuit comprising:
   a frequency and phase detector for generating a difference signal corresponding to a difference in a frequency and a phase between an input signal and a reference signal;

a filter for generating a filtered difference signal by filtering said difference signal generated by said frequency and phase detector to a predetermined frequency band;

a voltage controlled oscillator for generating a signal having a frequency varying according to a voltage of said filtered difference signal generated by said filter;

a level detector for generating dividing ratio control information by detecting a voltage level of said filtered difference signal generated by said filter, wherein said level detector comprises a dividing circuit for dividing a supply voltage into a voltage level of a prescribed ratio to generate a divided voltage level and a comparing circuit for comparing said divided voltage level with said voltage level of said filtered difference signal to generate said dividing ratio control information; and a variable frequency divider for determining a dividing ratio according to said dividing ratio control information and generating said reference signal which is supplied to said frequency and phase detector by dividing said signal generated by said voltage controlled oscillator by said dividing ratio.

2. The wide band phase locked loop circuit as claimed in claim 1, wherein said dividing circuit comprises a plurality of resistors each having a same resistance value.

3. The wide band phase locked loop circuit as claimed in claim 1, wherein said variable frequency divider comprises:

a divider for dividing said signal generated by said voltage controlled oscillator by different dividing ratios to generate a plurality of signals each having a different frequency; and a multiplexer for selecting one of said plurality of signals generated by said divider according to said dividing ratio control information.

4. The wide band phase locked loop circuit as claimed in claim 3, wherein said comparing circuit comprises a plurality of comparators and the number of said plurality of comparators is determined by the number of dividing ratios provided by said divider.

5. The wide band phase locked loop circuit as claimed in claim 1, wherein said variable frequency divider comprises:

a divider for dividing said signal generated by said voltage controlled oscillator by different dividing ratios to generate a plurality of signals each having a different frequency; and a multiplexer for selecting one of said plurality of signals generated by said divider according to said dividing ratio control information.

6. The wide band phase locked loop circuit as claimed in claim 1, wherein said voltage controlled oscillator is a narrow band voltage controlled oscillator.

7. The wide band phase locked loop circuit as claimed in claim 1, wherein said filter is a low pass filter.

\* \* \* \* \*